United States Patent
Story et al.

(10) Patent No.: US 9,246,439 B2
(45) Date of Patent: Jan. 26, 2016

(54) CURRENT REGULATED TRANSIMPEDANCE AMPLIFIERS

(71) Applicant: Cambridge Silicon Radio Limited, Cambridge (GB)

(72) Inventors: MIchael Story, Cambridge (GB); Gerald Miaille, Cambridge (GB)

(73) Assignee: CAMBRIDGE SILICON RADIO LIMITED, Cambridge (GB)

( * ) Notice: Subject to any disclaimer, the term of this patent is extended or adjusted under 35 U.S.C. 154(b) by 0 days.

(21) Appl. No.: 14/282,297

(22) Filed: May 20, 2014

(65) Prior Publication Data

US 2015/0340995 A1    Nov. 26, 2015

(51) Int. Cl.
*H03F 3/08* (2006.01)
*H03F 1/02* (2006.01)
*H03F 3/16* (2006.01)
*H02M 3/155* (2006.01)

(52) U.S. Cl.
CPC ............. *H03F 1/0222* (2013.01); *H02M 3/155* (2013.01); *H03F 3/16* (2013.01); *H03F 2200/294* (2013.01)

(58) Field of Classification Search
USPC ................... 330/267, 273, 296, 289
See application file for complete search history.

(56) References Cited

U.S. PATENT DOCUMENTS 7,696,909 B2 *   4/2010   Oberhuber ................. 341/119
7,912,440 B2 *   3/2011   Groeneweg ................ 455/333

* cited by examiner

*Primary Examiner* — Hieu Nguyen
(74) *Attorney, Agent, or Firm* — Procopio, Cory, Hargreaves & Savitch LLP

(57) ABSTRACT

A transimpedance amplifier includes a current regulator having a first current mirror of a first conduction type and a first current mirror of a second conduction type. The first current mirror stage of a first conduction type receives a reference current. The first current mirror stage of a second conduction type is connected to the first current mirror stage of the first conduction type, and receives an output current from the first current mirror stage of the first conduction type, and to generate a current to be used as a current source by a transimpedance amplifier. Each of the current mirror stages includes a first transistor and a second transistor of the same conduction type having their gate terminals connected wherein the first transistor receives an input current and the second transistor provides an output current that is a factor of the received input current.

14 Claims, 7 Drawing Sheets

CURRENT REGULATED TRANSIMPEDANCE AMPLIFIERS

TECHNICAL FIELD

The present disclosure relates to transimpedance amplifiers that are driven by current sources. It is particularly related to, but in no way limited to, TIAs used for radio frequency (RF) low noise amplifiers (LNA) and analog-to-digital converters (ADC).

BACKGROUND

Transimpedance amplifiers (TIA) are commonly used for providing a voltage output signal proportional to a current signal and are normally implemented by providing a feedback resistor across the input and output nodes of an operational amplifier. TIAs are often known as current to voltage converters. One use of a TIA is to convert an input current signal into an output voltage signal.

FIG. 1 shows a transimpedance amplifier 100 implemented with MOSFETs. The TIA comprises an n-channel MOSFET (NMOS) 110 and a p-channel MOSFET (PMOS) 120 arranged such that the gate terminals 112, 122 of the MOSFETs are tied to an input $v_{in}$, and the drain terminals 114, 124 of the MOSFETs are tied to an output $v_{out}$. The source terminal 126 of the PMOS is connected to a current source 130 and a discharge capacitor 140. A feedback resistor 150 is connected across the TIA 100. With this arrangement, the gain $G_m$ of the amplifier is controlled by the current $I_S$ provided to the TIA by the current source 130 where $G_m \propto \sqrt{I_S}$.

In RF receiver modules, TIAs generally function as low-noise pre-amplifiers, which largely determine the overall performance of the module. In the past, because of the wide bandwidth and the high gain necessary for sensitive data links, TIAs have been implemented with bipolar and gallium arsenide (GaAs) metal-semiconductor field effect transistors (MESFET). These implementations result in high speed devices, but they can be costly and the production processes lack high-yield manufacturability. Recently, metal-oxide-semiconductor (MOS) technology has become popular for the design of TIAs because of its low cost and high-yield manufacturability. However, using a single MOS gain stage fails to provide enough gain for multi-gigabit operation, because MOS transistors have a lower transconductance than bipolar transistors. Hence, successful high-speed MOS implementations have relied on multiple gain stages.

At present, the current supplied to a TIA is fixed at a maximum value that ensures the highest gain $G_{m(max)}$ from the TIA. However, this gain is not always required and so during normal operation of the TIA, this high current is mostly taken up by the load. This unnecessarily increases the power consumption of the TIA when $G_{m(max)}$ is not required.

In view of the above, there remains a need to provide a TIA which is driven by a current source that is adaptive to the requirements of the TIA circuit such that a high current source is only provided to a component of the circuit (when $G_{m(max)}$ is required) while supplying the remaining components of the circuit with lower current sources so as to minimise the overall power consumption.

SUMMARY OF THE INVENTION

This invention relates to a current regulator for generating at least one current source to a current driven transimpedance amplifier. A multi-stage RF transimpedance amplifier comprising a plurality of current driven transimpedance stages is also detailed.

There is therefore provided a current regulator comprising a first current mirror stage of a first conduction type configured to receive a reference current; and a first current mirror stage of a second conduction type connected to the first current mirror stage of the first conduction type and configured to receive an output current from the first current mirror stage of the first conduction type, and to generate a current to be used as a current source, wherein each of said current mirror stages comprises a first transistor and a second transistor of the same conduction type, said transistors having their gate terminals connected wherein the first transistor is configured to receive an input current and the second transistor is configured to output a current that is a factor of the received input current.

There is further provided a current regulator wherein the second transistor in the first current mirror stage of the first conduction type comprises a plurality of transistors connected in parallel, said plurality being captured by a replication factor ITRIM that is indicative of the number of transistors connected in parallel that make up the second transistor in the first current mirror stage of the first conduction type.

Also provided is a current regulator wherein the first transistor in the first current mirror stage of the second conduction type comprises a plurality of transistors connected in parallel, said plurality being captured by a replication factor ISET that is indicative of the number of transistors connected in parallel that make up the first transistor in the first current mirror stage of the second conduction type.

A current regulator wherein the current generated by the first current mirror stage of the second conduction type is a factor of ITRIM and ISET is also provided.

Still further, there is provided a current regulator comprising a plurality of further current mirror stages of the second conduction type connected in cascade to the first current mirror stage of the second conduction type wherein each of said plurality of further current mirror stages of the second conduction type generate further currents to be used as further current sources.

A plurality of further current mirror stages of the first conduction type is also provided where the plurality of further current mirror stages is connected in cascade to the first current mirror stage of the first conduction type wherein each of said plurality of further current mirror stages of the first conduction type feeds a plurality of first current mirror stages of a second conduction type connected in cascade, each of said plurality of first current mirror stages of a second conduction type generating a current to be used as a current source.

Also provided is a current regulator wherein each of said plurality of further current mirror stages of the first and/or second conduction type has a unique ISET value. Additionally, a current regulator wherein each of said plurality of further current mirror stages of the first conduction type has a unique ITRIM value. Preferably, ISET has a nominal value of 4 and ITRIM has a nominal value of 8, and, optionally, wherein the current regulator generates between 8 to 10 current sources.

There is further provided a current regulated transimpedance amplifier comprising a first transistor of a first conduction type; a second transistor of a second conduction type opposite to that of the first conduction type, said second transistor coupled to said first transistor; an input terminal for receiving an input signal, wherein the gate terminals of said first and second transistors are coupled to each other and to said input terminal; an output terminal for transmitting an output signal, wherein the output terminal is coupled to said first and second transistors; and a current regulator as described above for supplying a current source to the first transistor.

Also provided is a multi-stage RF transimpedance amplifier circuit comprising a plurality of transimpedance amplifier stages supplied with current sources generated by a current regulator as described above.

FIGURES

DETAILED DESCRIPTION

Figure 1:
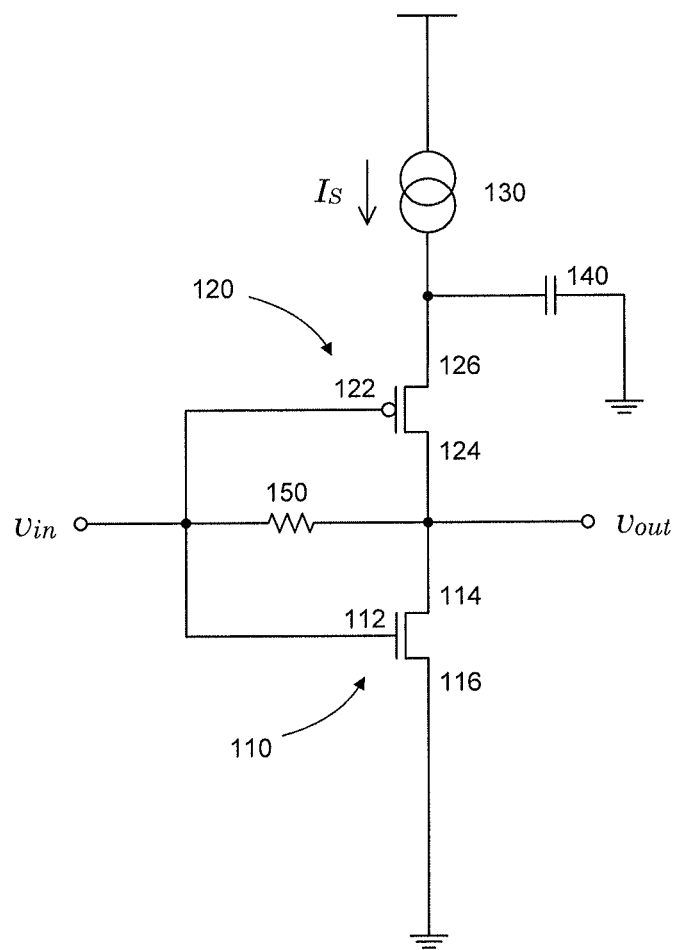
FIG. 1 shows a schematic circuit diagram of a transimpedance amplifier as presently known in the art.
Figure 2A:
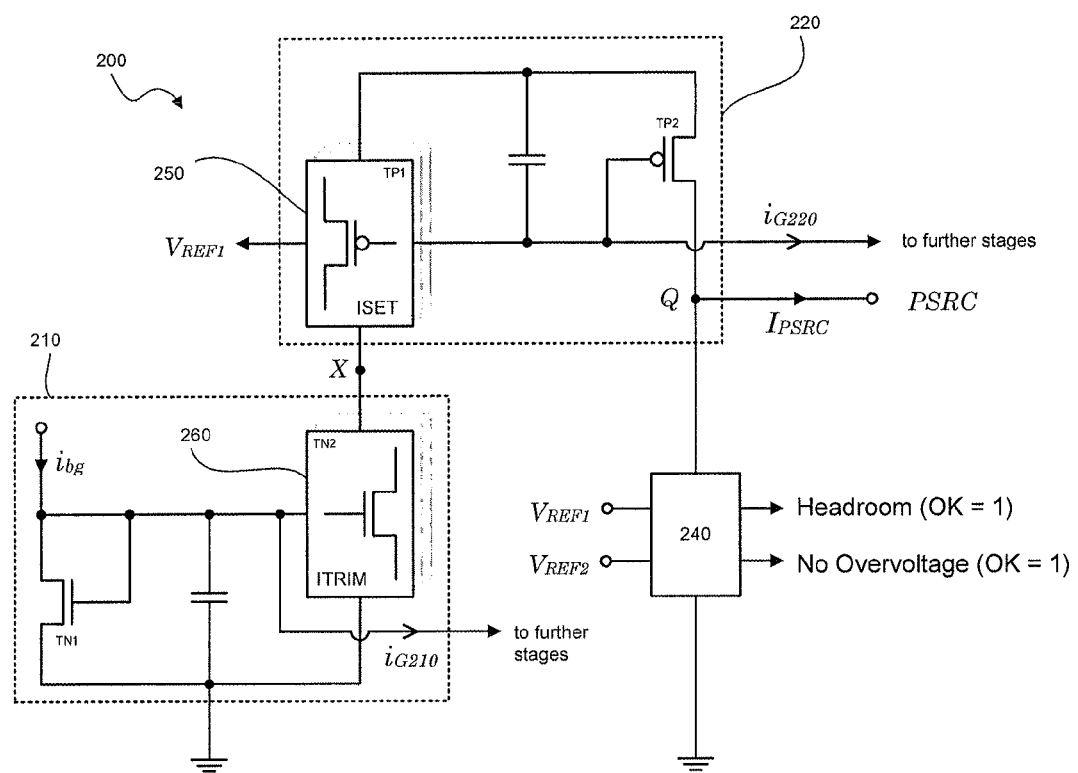
FIG. 2A shows a current regulator circuit according to an embodiment of the present invention.

An embodiment of the present invention is shown in the current regulator circuit of FIG. 2A. The current regulator 200 comprises two interconnected current mirrors 210 and 220. Current mirror 210 comprises NMOS transistors TN1 and TN2 and is configured to receive a bandgap reference current $i_{bg}$. Accordingly, the current flowing through point X in the NMOS current mirror 210 is $pi_{bg}$, where p is a factor between 22.5 and 27.5. This current then flows through the PMOS current mirror 220, and results in an output current of $I_{PSRC}$ as shown in FIG. 2A. Current $I_{PSRC}$ is used as a current source PSRC in place of the current source 130 in the TIA shown in FIG. 1.

In one embodiment of the present invention, PMOS transistor TP1 comprises a plurality of PMOS transistors 250 connected in parallel. The number of PMOS transistors connected in parallel to form transistor TP1 of the PMOS current mirror 220 gives rise to a parameter ISET. ISET is a replication factor and is indicative of the number of PMOS transistors 250 connected in parallel to form the left-hand branch of the PMOS current mirror 220 as illustrated in FIG. 2A. Similarly, in a further embodiment of the present invention, the NMOS transistor TN2 comprises a plurality of NMOS transistors 260 connected in parallel. The number of NMOS transistors connected in parallel to form transistor TN2 of the NMOS current mirror 210 gives rise to a parameter ITRIM which is a replication factor that is indicative of the number of NMOS transistors 260 connected in parallel to form the right-hand branch of the NMOS current mirror 210 as depicted in FIG. 2A.

It can therefore be seen that both ITRIM and ISET enable control of the output current $I_{PSRC}$, where ISET enables course control of the output current $I_{PSRC}$ while ITRIM allows fine control (±10%) of output current $I_{PSRC}$. Accordingly, the magnitude of $I_{PSRC}$ can be shown to be dependent on ISET and ITRIM according to:

$$I_{PSRC} = \alpha \beta n \cdot i_{bg}$$

where:
$i_{bg}$ is the bandgap current (used herein as a reference current),
n is the number of unit PMOS fingers in parallel in the circuit layout used for the TIA, typically between 6 to 200,
$\beta$ is the value set by ISET and is given by $\beta=75/(4\times(10-\text{ISET}))$, and
$\alpha$ is the value set by ITRIM and is given by $\alpha=1+((\text{ITRIM}-8)/80)$.

Figure 2B:
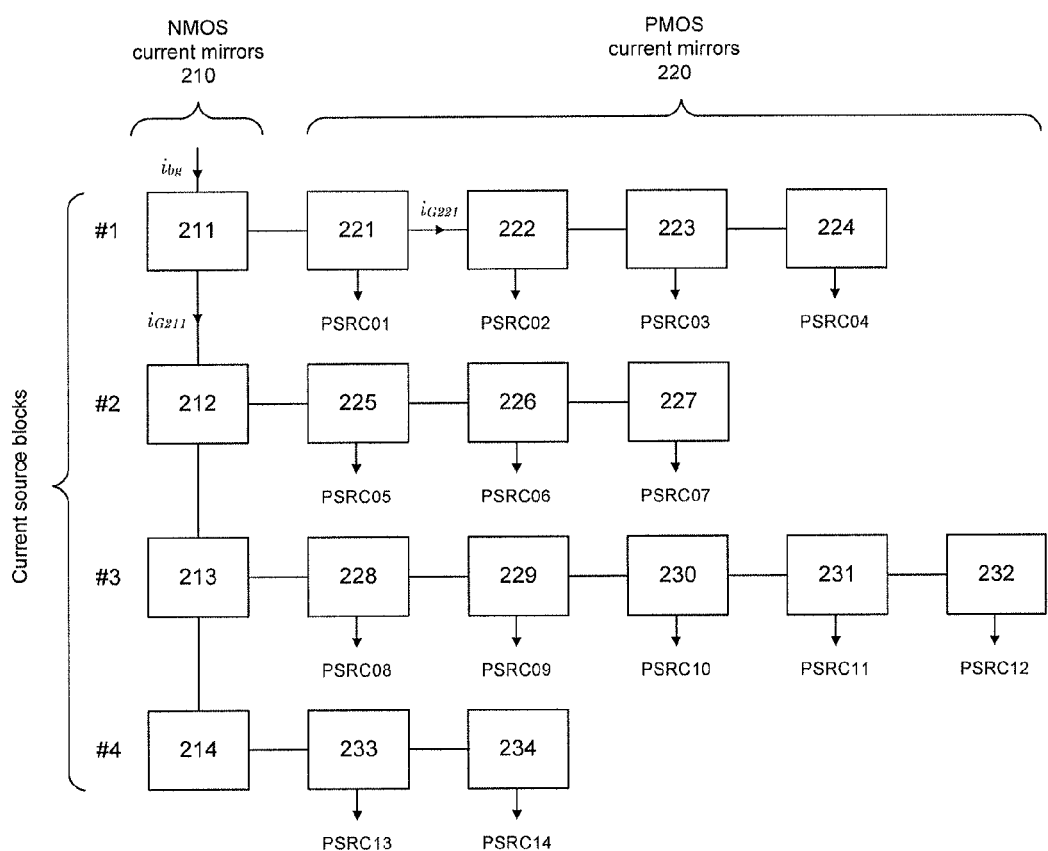
FIG. 2B shows a schematic representation of a current regulator circuit used to generate a plurality of current sources according to an embodiment of the present invention.

In an embodiment of the present invention, the current regulator circuit 200 may be implemented to generate a plurality of current sources. This is achieved by cascading several PMOS current mirror stages similar to PMOS current mirror 220 per NMOS current mirror 210. An example of such an arrangement is shown in the schematic diagram of FIG. 2B which generates current sources PSRC01 to PSRC14. In FIG. 2B, the current sources are generated in four current source blocks labelled "#1", "#2", "#3" and "#4". Each of the current source blocks has an NMOS current mirror similar to current mirror 210 shown in FIG. 2A; NMOS current mirrors 211 to 214 are similar to current mirror 210; each of the NMOS current mirrors 211 to 214 have a different number of NMOS transistors connected in parallel that make up transistor TN2 of FIG. 2A. Thus, NMOS current mirrors 211 to 214 each have a different associated ITRIM parameter. NMOS current mirrors 211 to 214 are cascaded together where the gate current from one NMOS current mirror is fed into the subsequent NMOS current mirror. In this example, the first NMOS current mirror 211 takes $i_{bg}$ as the input current. The gate current $i_{G211}$ of the current mirror 211 is fed into the NMOS current mirror of the next stage 212, and so on.

Referring to FIG. 2B, each NMOS current mirror 211 to 214 feeds at least one PMOS current mirror 221 to 234; this has been seen in FIG. 2A where NMOS current mirror 210 feeds PMOS current mirror 220. In the case of the current source blocks of FIG. 2B, NMOS current mirror 211 of current source block #1 feeds a cascade of four PMOS current mirrors 221 to 224 where the gate current $i_{G221}$ from PMOS current mirror 221 is fed into the subsequent PMOS current mirror 222, for example. This gives rise to current sources PSRC01 to PSRC04 in current source block #1. Similarly in current source block #2, NMOS current mirror 212 feeds PMOS current mirrors 225 to 227 connected in cascade, generating current sources PSRC05 to PSRC07. In current source block #3, NMOS current mirror 213 feeds cascaded PMOS current mirrors 228 to 232 giving current sources PSRC08 to PSRC12. In current source block #4, NMOS current mirror 214 feeds cascaded PMOS current mirrors 233 and 234 which generate current sources PSRC13 to PSRC14.

In each current source block, the PMOS current mirrors 221 to 234 in FIG. 2B are similar to PMOS current mirror 220 in FIG. 2A; each of the PMOS current mirrors 221 to 234 have a different number of PMOS transistors connected in parallel that make up transistor TP1 of FIG. 2A. Thus, the PMOS current mirrors within each current source block each have a different associated ISET parameter, i.e. PMOS current mirrors 221 to 224, 225 to 227, 228 to 232, and 233 to 234 each have a different ISET parameter.

In an exemplified embodiment of the present invention, the current regulator 200 generates fourteen different current sources PSRC01 to PSRC14; each of these sources has specific functions when used in conjunction with a TIA. This is illustrated in the current source list shown in Table 1. However it will be appreciated that any number of current sources may be generated by the current regulator based on the requirements of the recipient device.

More current sources may be made available for use by combining the current sources that have been generated. For example, referring to Table 1, PSRC15 is a derivative current source resulting from the combination of current sources PSRC01 and PSRC09. In Table 1, current sources PSRC15 to PSRC20 are derivative current sources created from a combination of the current sources PSRC01 to PSRC14 and/or any of derivative current sources PSRC15 to PSRC20. In a further embodiment of the present invention, between 8 to 10 different current sources are generated. In a specific example of the present invention, nominal mid-range values of ISET=4 and ITRIM=8 result in a current of 625 nA per finger of the PMOS transistors used for the TIA.

Figure 2C:
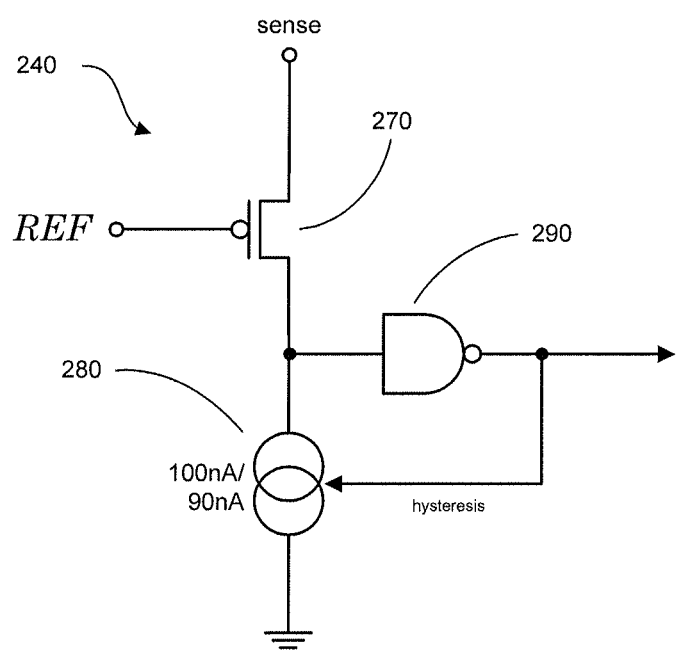
FIG. 2C shows a sensing circuit used by the current regulator circuit according to an embodiment of the present invention.

Each PMOS current mirror 220 has a sensing circuit 240 for overvoltage and headroom sensing for each of the generated current sources, as shown in FIG. 2A. The overvoltage sensing protects the voltage regulator circuit 200 against high output voltages from the generated current source. Headroom sensing indicates when there is insufficient headroom (voltage difference) between the power supply and the output voltage from the generated current source. A sensing circuit 240 is shown in FIG. 2C and comprises a PMOS transistor 270 connected to a current source 280 and an inverter 290. Hysteresis of about 10% is applied to the output of the inverter 290. A reference voltage $V_{REF1}$ or $V_{REF2}$ is input to the gate of the transistor 270. In one embodiment, the current source 280 is implemented as a 90 nA or 100 nA current source. Both types of sensing use the same circuit 240 from the same sense point Q as shown in FIG. 2A. Headroom sensing is done for each generated current source and uses a VDsat generator to detect a headroom reference voltage $V_{REF1}$ of less than approximately $V_{REF1}=2V_{D(sat)}$. $V_{REF1}$ is obtained from each PMOS current mirror 220 as shown in FIG. 2A. When $V_{REF1}$ is greater than about $2V_{D(sat)}$, the respective output of the sensing circuit 240 goes high. Overvoltage sensing is done globally across all current sources using a predefined reference voltage $V_{REF2}$. The outputs from the sensing circuit 240 for each of overvoltage and headroom sensing are digital. In the embodiment of the present invention where multiple PMOS current mirrors 220 are used to generate a series of current sources, each having respective sensing circuits 240, the digital outputs of each of the respective sensing circuits 240 are combined in a NAND manner for each of overvoltage and headroom sensing.

The current regulator of the present invention is therefore able to generate a series of current sources to be used in TIAs and the like. Such a series of current sources PSRC01 to PSRC20 is shown in Table 1, of which PSRC15 to PSRC20 are derivative current sources. Exemplary functions of the respective current sources are also listed for illustrative purposes only.

Figure 3:
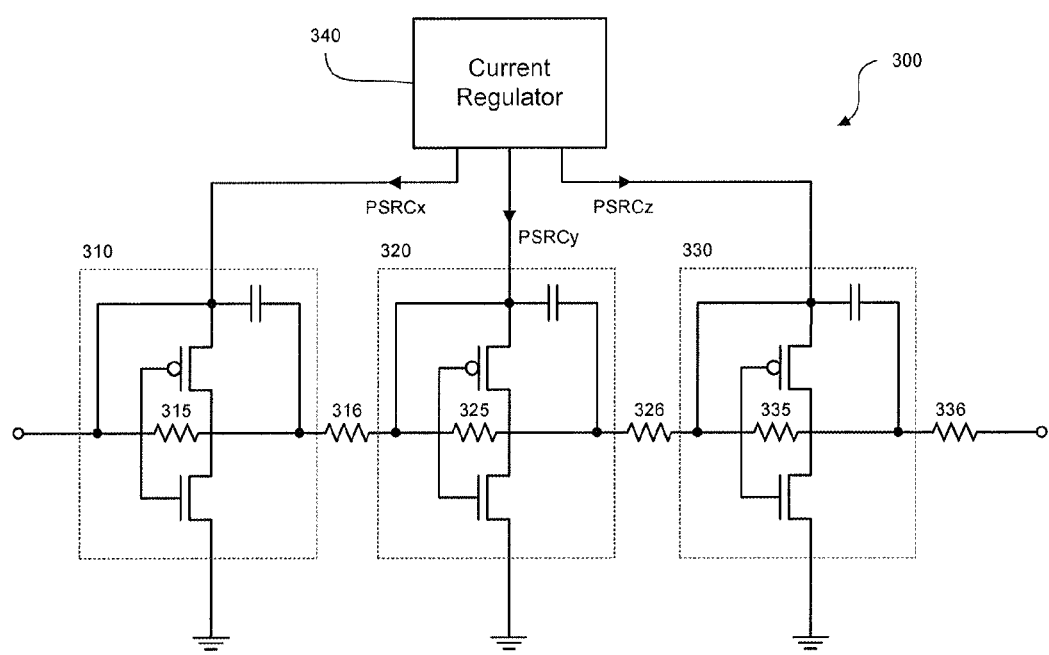
FIG. 3 shows a cascade configuration of transimpedance amplifiers driven by a current regulator according to an embodiment of the present invention.

An implementation of the current regulator of the present invention will now be illustrated with respect to FIG. 3. This figure shows a transimpedance amplifier circuit 300 in which multiple TIA stages 310, 320 and 330, each with a gain $G_{m(1)}$, $G_{m(2)}$ and $G_{m(3)}$, are connected in series. Such an arrangement of amplifiers can often be found in analog to digital converters (ADC) and low noise amplifiers (LNA). In FIG. 3, each of the TIAs 310, 320 and 330 has a corresponding feedback resistor 315, 325 and 335, and a corresponding load resistor 316, 326 and 336. In the implementation shown, the TIAs 310, 320 and 330 are driven by respective current sources PSRCx, PSRCy and PSRCz. These current sources are generated by a current regulator 340 such as that described in relation to FIG. 2A using PMOS and NMOS current mirrors configured with appropriate ISET and ITRIM values.

In the configuration shown in FIG. 3, the gain $G_T$ of the multi-stage TIA 300 is the product of the individual gains of the cascaded amplifiers, i.e. $G_T = \pi_i^n G_{m(i)}$ for n cascaded stages. Thus in FIG. 3, $G_T$ for TIAs 310, 320 and 330 is $G_{m(1)} \cdot G_{m(2)} \cdot G_{m(3)}$. It therefore follows that for a multi-stage TIA configuration as shown in FIG. 3, a target gain $G_T$ can be attained without requiring the gain $G_{m(i)}$ of each of the constituent TIAs to be equivalent to $G_T$. In this manner, the current source required to drive the cascaded amplifiers need not be as large as would be required in a single stage TIA configuration; instead the larger current source is only provided by the current regulator to the TIA stage with the higher gain. This minimises on power consumption of the multi-stage TIA.

From the above, it can be seen that the current regulator of the present invention enables the generation of current sources as required using the appropriate ISET and/or ITRIM replication factor in the respective current mirrors that form the current regulator. Thus when more current is required by a device (such as a TIA), a suitable current source generated by the current regulator is used. This highlights the ability of the current regulator of the present invention to supply suitable current sources on demand.

Figure 4A:
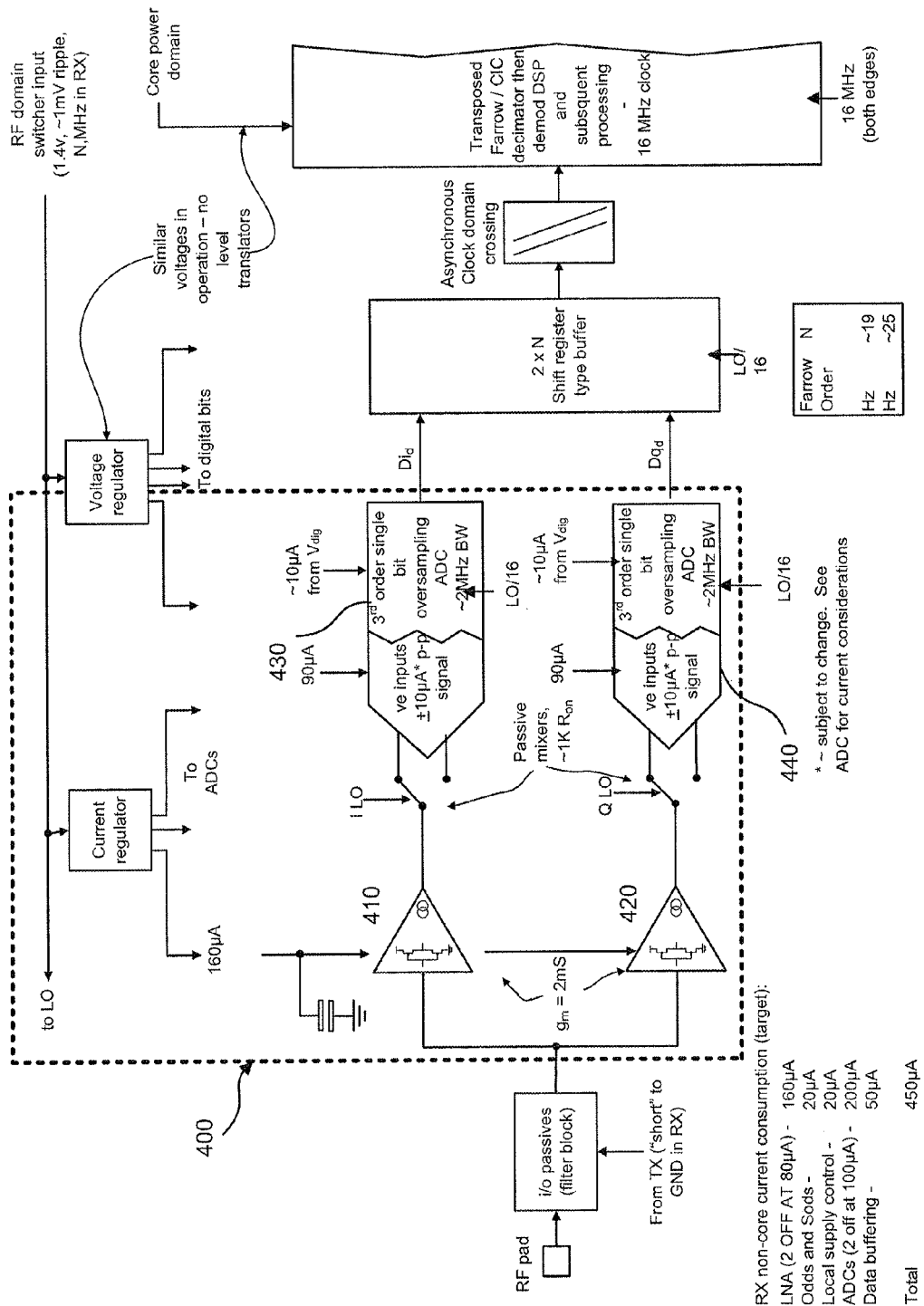
FIG. 4A shows a radio frequency receiver circuit comprising the current regulator circuit according to an embodiment of the present invention.
Figure 4B:
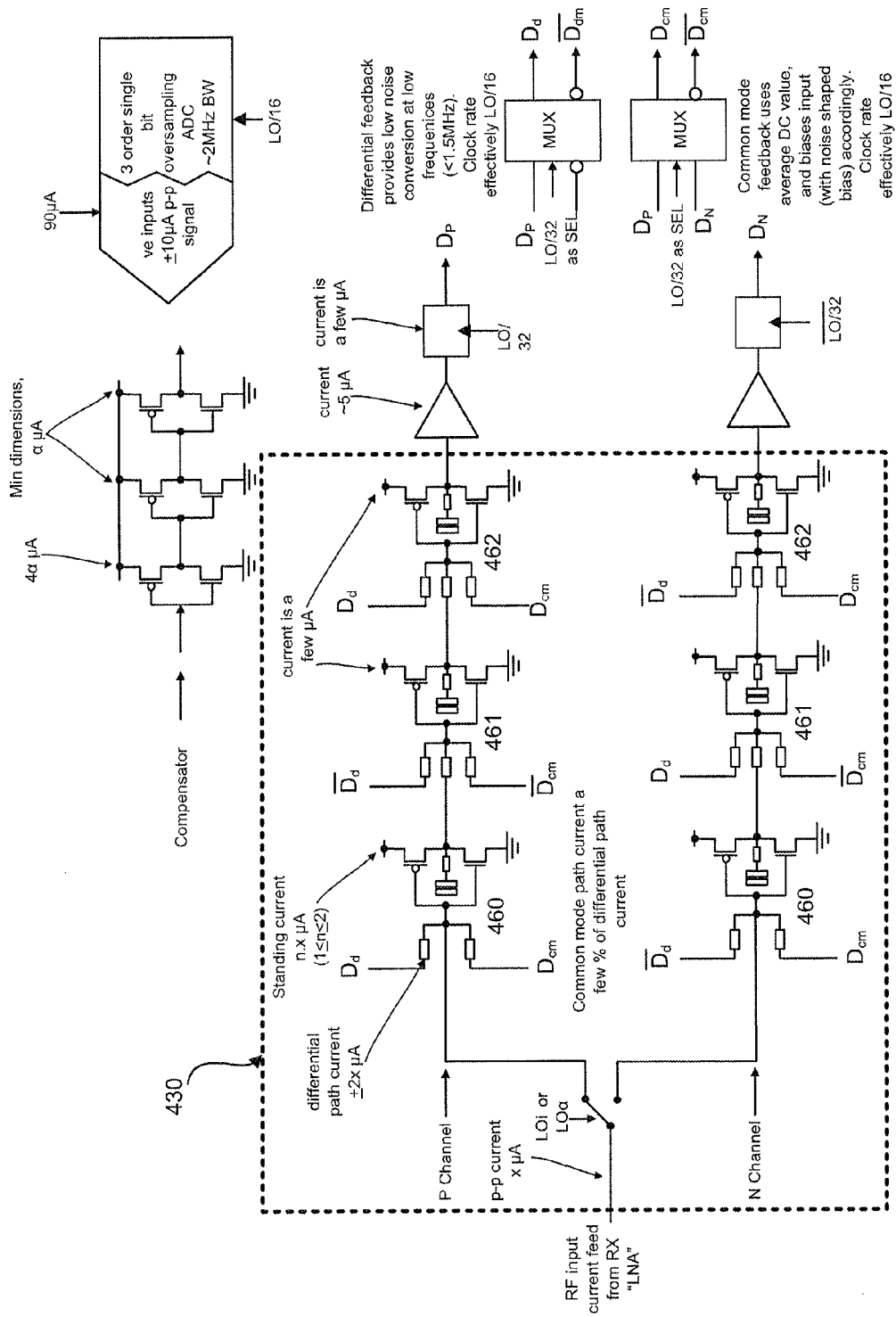
FIG. 4B shows an analog-to-digital converter circuit as presently known in the art, comprising the current regulator circuit according to an embodiment of the present invention.

A further embodiment of the present invention is shown in FIG. 4A which shows the current regulator of the present invention implemented in an RF receiver module 400. The receiver module 400 comprises LNAs 410 and 420, and ADCs 430 and 440. Each of the LNAs 410 and 420 comprise a TIA as previously described. In FIG. 4A, current regulator 450 is used to supply each of the LNAs and the ADCs with a current source (such as those exemplified in Table 1). This current regulator is similar to that shown in FIG. 2A. Each LNA 410 and 420 has the configuration as shown in FIG. 1. The inner circuitry of each of the ADCs 430 and 440 is shown in FIG. 4B and comprises a plurality of cascaded TIAs 460 to 465. In an embodiment of the present invention, each of the TIAs in the LNAs and the ADCs are supplied by an appropriate current source provided by the current regulator 450. The current requirements of the LNAs may vary from those of the ADCs; thus the current sources provided by the current regulator 450 to the LNAs are different to those provided to the ADCs. As previously mentioned, the current sources generated by the current regulator 450 may be varied by adjusting the ISET and, if necessary (where more than one current source block is used) ITRIM. These varying requirements of the RF receiver module for current sources of different magnitude are therefore satisfied by a current regulator according to the present invention. By providing various current sources, only a few of which are large in magnitude, the overall power consumption of the RF receiver module is minimised.

It will be understood that the above description of a preferred embodiment is given by way of example only and that various modifications may be made by those skilled in the art. Although various embodiments have been described above with a certain degree of particularity, or with reference to one or more individual embodiments, those skilled in the art could make numerous alterations to the disclosed embodiments without departing from the spirit or scope of this invention.

TABLE 1

| PSRC | Use | μA |
|---|---|---|
| PSRC01 | Ipbuffer | 180 |
| PSRC02 | Q Buffer | 111 |
| PSRC03 | I Buffer | 105 |
| PSRC04 | Spare | 0 |
| PSRC05 | Spare | 0 |
| PSRC06 | ADC0 and DAC | 130 |
| PSRC07 | ADC0 bias cascode | 10 |
| PSRC08 | ADC0 comparator | 20 |
| PSRC09 | Spare | 5 |
| PSRC10 | ADC digital | 65 |
| PSRC11 | ADC1 and DAC | 130 |
| PSRC12 | ADC1 bias cascode | 10 |
| PSRC13 | ADC1 comparator | 20 |
| PSRC14 | Spare | 0 |
| PSRC15 (PSRC01 + PSRC09) | Clamp bias | 185 |
| PSRC16 (PSRC03 + PSRC09) | LNA 0 | 110 |
| PSRC17 (PSRC07 + PSRC16) | LNA 1 | 120 |
| PSRC18 (PSRC10 + PSRC13) | IQCAL and Rxip | 85 |
| PSRC19 (PSRC02 + PSRC15) | LNA bias | 296 |
| PSRC20 (PSRC16 + PSRC18) | Mixbias | 195 |

The invention claimed is:

1. A current regulated transimpedance amplifier comprising:
   a first transistor of a first conduction type;
   a second transistor of a second conduction type opposite to that of the first conduction type, said second transistor coupled to said first transistor;
   an input terminal for receiving an input signal, wherein the gate terminals of said first and second transistors are coupled to each other and to said input terminal;
   an output terminal for transmitting an output signal, wherein the output terminal is coupled to said first and second transistors; and
   a current regulator for supplying current to the first transistor, the current regulator comprising:
      a first current mirror stage of a first conduction type configured to receive a reference current; and
      a first current mirror stage of a second conduction type connected to the first current mirror stage of the first conduction type and configured to receive an output current from the first current mirror stage of the first conduction type, and to generate a current to be used as a current source,
   wherein each of said current mirror stages comprises a first transistor and a second transistor of the same conduction type, said transistors having their gate terminals connected wherein the first transistor is configured to receive an input current and the second transistor is configured to output a current that is a factor of the received input current.

2. The current regulated transimpedance amplifier according to claim 1, wherein the second transistor in the first current mirror stage of the first conduction type comprises a plurality of transistors connected in parallel, said plurality being captured by a replication factor ITRIM that is indicative of the number of transistors connected in parallel that make up the second transistor in the first current mirror stage of the first conduction type.

3. The current regulated transimpedance amplifier according to claim 1, wherein the first transistor in the first current mirror stage of the second conduction type comprises a plurality of transistors connected in parallel, said plurality being captured by a replication factor ISET that is indicative of the number of transistors connected in parallel that make up the first transistor in the first current mirror stage of the second conduction type.

4. The current regulated transimpedance amplifier according to claim 3, wherein the current generated by the first current mirror stage of the second conduction type is a factor of ITRIM and ISET.

5. The current regulated transimpedance amplifier according to claim 1, further comprising a plurality of further current mirror stages of the second conduction type connected in cascade to the first current mirror stage of the second conduction type wherein each of said plurality of further current mirror stages of the second conduction type generate further currents to be used as further current sources.

6. The current regulated transimpedance amplifier according to claim 1, further comprising a plurality of further current mirror stages of the first conduction type connected in cascade to the first current mirror stage of the first conduction type wherein each of said plurality of further current mirror stages of the first conduction type feeds a plurality of first current mirror stages of a second conduction type connected in cascade, each of said plurality of first current mirror stages of a second conduction type generating a current to be used as a current source.

7. The current regulated transimpedance amplifier according to claim 5, wherein each of said plurality of further current mirror stages of the first and/or second conduction type has a unique ISET value.

8. The current regulated transimpedance amplifier according to claim 6, wherein each of said plurality of further current mirror stages of the first conduction type has a unique ITRIM value.

9. The current regulated transimpedance amplifier according to claim 1, wherein the first conduction type is N-type and the second conduction type is P-type.

10. The current regulated transimpedance amplifier according to claim 1 wherein the transistors are metal-oxide-semiconductor (MOS) transistors.

11. The current regulated transimpedance amplifier according to claim 1, wherein the reference current is a bandgap reference current.

12. The current regulated transimpedance amplifier according to claim 3, wherein ISET has a nominal value of 4 and ITRIM has a nominal value of 8.

13. The current regulated transimpedance amplifier according to claim 1, wherein between 8 to 10 current sources are generated by the current regulator.

14. A multi-stage RF transimpedance amplifier circuit comprising the current regulated transimpedance amplifier of claim 1, and at least one more transimpedance amplifier stages supplied with current generated by said current regulator.

* * * * *